(12) United States Patent
Iwatani

(10) Patent No.: US 11,543,745 B2
(45) Date of Patent: Jan. 3, 2023

(54) STAGE DRIVING APPARATUS, LITHOGRAPHY APPARATUS, AND METHOD OF MANUFACTURING ARTICLE

(71) Applicant: CANON KABUSHIKI KAISHA, Tokyo (JP)

(72) Inventor: Satoshi Iwatani, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 334 days.

(21) Appl. No.: 16/363,025

(22) Filed: Mar. 25, 2019

(65) Prior Publication Data
US 2019/0302612 A1     Oct. 3, 2019

(30) Foreign Application Priority Data
Mar. 30, 2018   (JP) .............................. JP2018-069173

(51) Int. Cl.
*G03F 7/00*         (2006.01)
(52) U.S. Cl.
CPC .................................. G03F 7/0002 (2013.01)
(58) Field of Classification Search
CPC .............. G03F 7/0002; G03F 7/70716; G03F 7/70758; H02K 11/21; H02K 7/09; H02K 1/17
See application file for complete search history.

(56) References Cited

U.S. PATENT DOCUMENTS

| | | | |
|---|---|---|---|
| 5,699,621 A | | 12/1997 | Trumper |
| 5,957,753 A | * | 9/1999 | Komanduri ............. B24B 1/005 451/36 |
| 2005/0204948 A1 | * | 9/2005 | Post .................... F16C 32/0406 104/281 |

(Continued)

FOREIGN PATENT DOCUMENTS

| | | | |
|---|---|---|---|
| JP | S61149978 U | | 9/1986 |
| JP | H054717 | * | 1/1993 |

(Continued)

OTHER PUBLICATIONS

Office Action issued in Japanese Appln. No. 2018-069173 dated Dec. 13, 2021.

(Continued)

*Primary Examiner* — Michael M. Robinson
*Assistant Examiner* — Victoria Bartlett
(74) *Attorney, Agent, or Firm* — Rossi, Kimms & McDowell LLP

(57) ABSTRACT

The present invention provides a stage driving apparatus for driving a stage, the apparatus comprising: a linear motor including a stator having a plurality of coils arrayed along a driving direction of the stage, and a mover provided with the stage; and a controller configured to control the linear motor, wherein the mover includes a permanent magnet provided on one of an upper side and a lower side of the plurality of coils, and an electromagnet provided on the other, the stator includes a yoke member provided to cover the electromag- (Continued)

net side of the plurality of coils, and the controller controls driving of the stage in the driving direction while floating the mover relative to the stator by controlling energization to the plurality of coils and the electromagnet.

19 Claims, 10 Drawing Sheets

(56) References Cited

U.S. PATENT DOCUMENTS

| | | | | |
|---|---|---|---|---|
| 2007/0127006 | A1* | 6/2007 | Shibazaki | G03F 7/70666 355/72 |
| 2009/0002659 | A1* | 1/2009 | Hiyama | G03F 7/70758 355/53 |
| 2019/0214930 | A1* | 7/2019 | Mukai | H02P 6/16 |

FOREIGN PATENT DOCUMENTS

| | | |
|---|---|---|
| JP | H1123752 A | 1/1999 |
| JP | 2004248400 A | 9/2004 |
| KR | 1020090004506 A | 1/2009 |
| WO | 2018055772 A1 | 3/2018 |

OTHER PUBLICATIONS

Office Action issued in Korean Appln. No. 10-2019-0034774 dated Jan. 11, 2022.

* cited by examiner

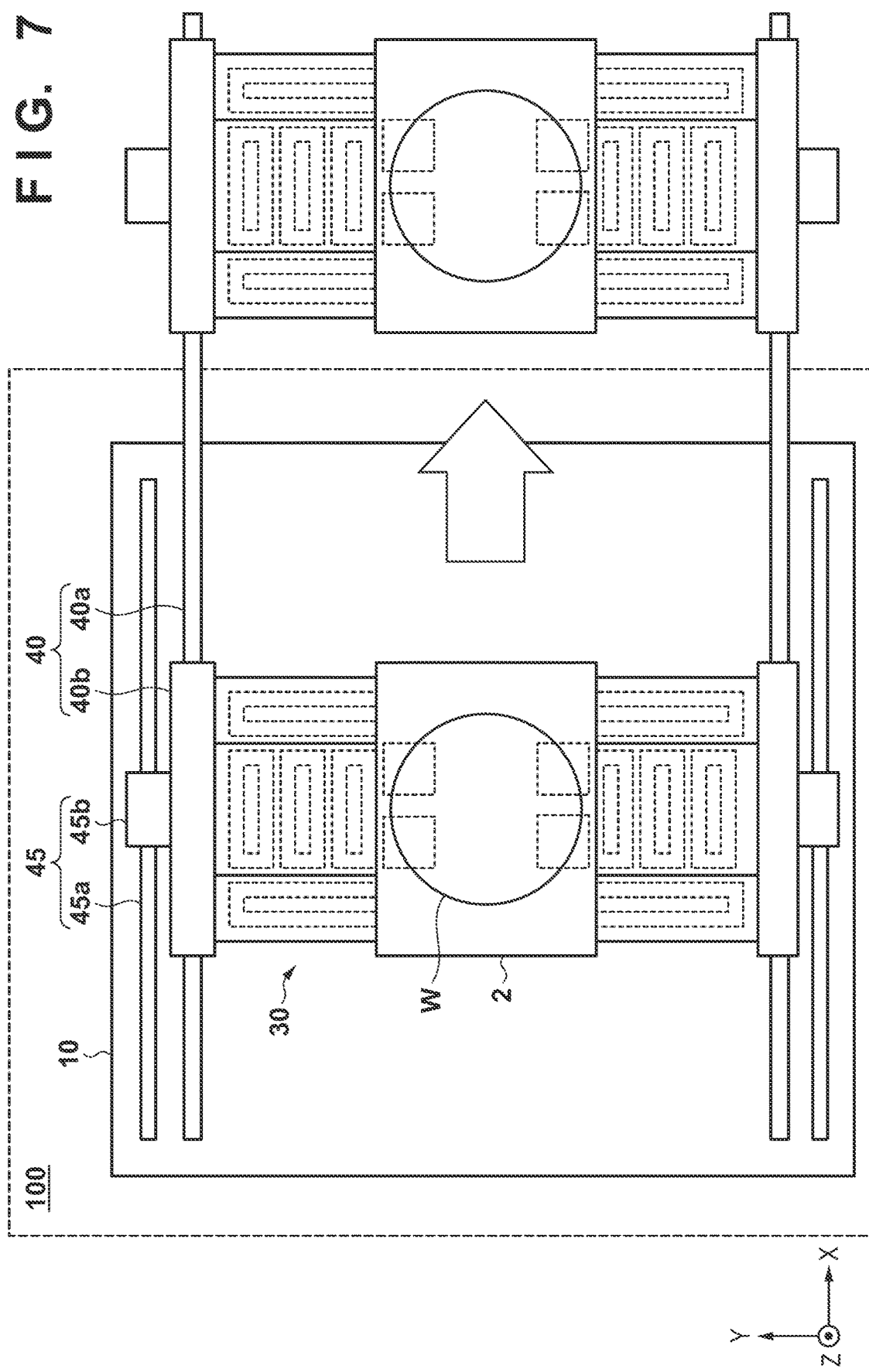

STAGE DRIVING APPARATUS, LITHOGRAPHY APPARATUS, AND METHOD OF MANUFACTURING ARTICLE

BACKGROUND OF THE INVENTION

Field of the Invention

The present invention relates to a stage driving apparatus, a lithography apparatus, and a method of manufacturing an article.

Description of the Related Art

A lithography apparatus used for the manufacture of semiconductor devices or the like can use, as a driving mechanism for a stage for holding a substrate, original, or the like, a linear motor having a stator on which a plurality of coils are arrayed and a mover provided with the stage. In general, a linear motor has a function of driving the mover along the arraying direction of the coils of the stator, but cannot float the mover relative to the stator. For this reason, a stage driving apparatus having a linear motor can be additionally provided with a mechanism for floating a stage (mover), such as a static pressure bearing. Japanese Patent Laid-Open No. 11-23752 has proposed a stage driving apparatus provided with an air bearing for floating a stage by blowing out a gas against a base.

As disclosed in Japanese Patent Laid-Open No. 11-23752, in the stage driving apparatus having the air bearing, particles (foreign particles) on the base may be scattered by the blowing out of a gas against the base to contaminate a substrate, original, or the like.

SUMMARY OF THE INVENTION

The present invention provides a stage driving apparatus advantageous in floating a stage with a simple arrangement.

According to one aspect of the present invention, there is provided a stage driving apparatus for driving a stage, the apparatus comprising: a linear motor including a stator having a plurality of coils arrayed along a driving direction of the stage, and a mover provided with the stage; and a controller configured to control the linear motor, wherein the mover includes a permanent magnet provided on one of an upper side and a lower side of the plurality of coils, and an electromagnet provided on the other of the upper side and the lower side of the plurality of coils, the stator includes a yoke member provided to cover the electromagnet side of the plurality of coils, and the controller controls driving of the stage in the driving direction while floating the mover relative to the stator by controlling energization to the plurality of coils and the electromagnet.

Further features of the present invention will become apparent from the following description of exemplary embodiments with reference to the attached drawings.

BRIEF DESCRIPTION OF THE DRAWINGS

FIG. 7 is a view showing an example of the arrangement of a stage driving apparatus according to the second embodiment;

DESCRIPTION OF THE EMBODIMENTS

Figure 1:
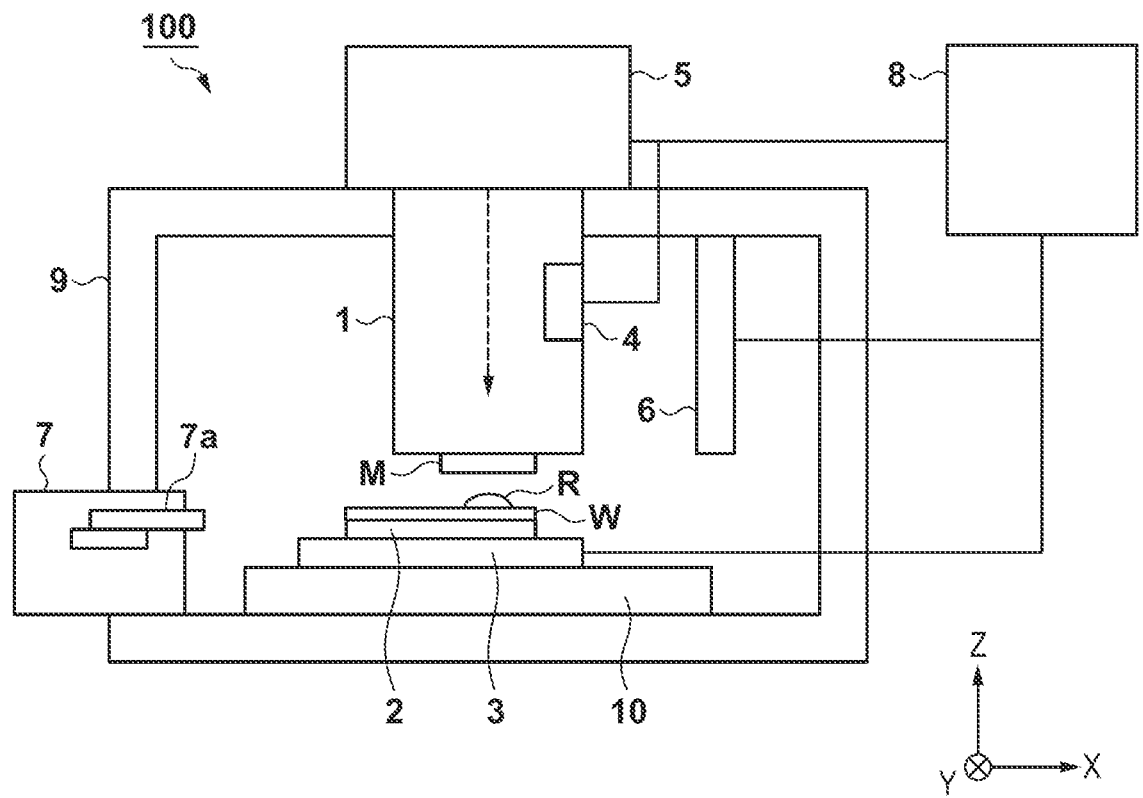
FIG. 1 is a schematic view showing the arrangement of an imprint apparatus.

Exemplary embodiments of the present invention will be described below with reference to the accompanying drawings. Note that the same reference numerals denote the same members throughout the drawings, and a repetitive description thereof will not be given.

The following embodiments each will exemplify a case in which a stage driving apparatus according to the present invention is applied to an imprint apparatus that forms a pattern of an imprint material onto a substrate by using a mold. However, this is not exhaustive. For example, the stage driving apparatus according to the present invention can also be applied to other types of lithography apparatuses such as an exposure apparatus that transfers a mask pattern onto a substrate and a drawing apparatus that forms a pattern on the substrate by irradiating it with chanted particle radiation. Assume that in the following description, directions orthogonal to each other within a plane parallel to a surface of a substrate are respectively defined as the X direction and the Y direction, and a direction perpendicular to the surface of the substrate is defined as the Z direction.

First Embodiment

An imprint apparatus 100 according to the first embodiment of the present invention will be described. The imprint apparatus is an apparatus for forming a pattern of a curable material onto which a pattern with protrusions and recesses on a mold is transferred by bringing an imprint material supplied onto a substrate into contact with the mold and applying energy for curing the imprint material. For example, the imprint apparatus 100 supplies an imprint material R onto a substrate, and cures the imprint material R while keeping a mold M on which a pattern with protrusions and recesses is formed in contact with the imprint material R on the substrate. The imprint apparatus 100 then forms the pattern of the imprint material R onto a substrate W by increasing the spacing between the mold M and the substrate W and separating (releasing) the mold M from the cured imprint material R. In the following description, such a series of processes performed by the imprint apparatus 100 will be sometimes referred to as an "imprint process".

As the imprint material, a curable composition (to be also referred to as a resin in an uncured state) to be cured by energy for curing is used. As the energy for curing, an electromagnetic wave, heat, or the like is used. The electromagnetic wave is, for example, light such as infrared rays, visible light, or UV rays whose wavelength is selected from the range of 10 nm to 1 mm (inclusive).

The curable composition is a composition cured by light irradiation or heating. A photo-curable composition cured by light contains at least a polymerizable compound and a photopolymerization initiator, and may contain a nonpolymerizable compound or a solvent as needed. The nonpolymerizable compound is at least one material selected from the group consisting of a sensitizer, a hydrogen donor, an internal mold release agent, a surfactant, an antioxidant, a polymer component, and the like.

The imprint material is applied in a film shape onto the substrate by a spin coater or a slit coater. Alternatively, the imprint material may be applied, onto the substrate, in a droplet shape or in an island or film shape formed by connecting a plurality of droplets using a liquid injection head. The viscosity (viscosity at 25° C.) of the imprint material is, for example, 1 mPa·s to 100 mPa·s (inclusive).

[Arrangement of Imprint Apparatus]

FIG. 1 is a schematic view showing the arrangement of the imprint apparatus 100 according to this embodiment. The imprint apparatus 100 includes a mold holding unit 1, a substrate stage 2, a driving unit 3, a measurement unit 4, a curing unit 5, a dispenser 6 (supplying unit), a conveyance unit 7 and a controller 8. The controller 8 includes, for example, a CPU and a memory (storage unit), and controls an imprint process (controls each unit of the imprint apparatus 100). In the case shown in FIG. 1, the mold holding unit 1, the measurement unit 4, the curing unit 5, and the dispenser 6 each are supported by a structure 9, and the substrate stage 2 is configured to move a base 10 upward. In the embodiment, the stage driving apparatus that drives the substrate stage 2 can be constituted by the driving unit 3 and the controller 8.

The mold M is generally manufactured by using a material that can transmit ultraviolet light, such as quartz. A pattern with protrusions and recesses to be transferred onto the imprint material R on the substrate is formed on a partial region on a surface of the mold M which is located on the substrate side. In addition, glass, ceramic, a metal, a semiconductor, a resin, or the like may be used for the substrate W, and a member made of a material different from that of the substrate may be formed on its surface, as needed. Specific examples of the substrate W include a silicon wafer, compound semiconductor wafer, and silica glass. An adhesive layer may be provided before the addition of an imprint material to improve the adhesiveness between the imprint material and the substrate, as needed.

The mold holding unit 1 holds the mold M by, for example, vacuum suction, and drives the mold M in the Z direction so as to change the spacing between the mold M and the substrate W. The mold holding unit 1 may have, for example, a function of driving the mold M in the X and Y directions and the θ direction (the rotating direction around the Z-axis) as well as a function of driving the mold M in the Z direction. The substrate stage 2 holds the substrate W by, for example, vacuum suction and is driven by the driving unit 3 in, for example, the X and Y directions. The detailed arrangement of the driving unit 3 will be described later.

The measurement unit 4 has a scope including, for example, an image sensor. The measurement unit 4 measures the relative position between the mold M and the substrate W by detecting the positional relationship between the mark provided on the mold M and the mark provided on the substrate W with the scope. The curing unit 5 cures the imprint material R by irradiating the imprint material R with light (for example, ultraviolet light) via the mold M while the mold M is in contact with the imprint material R on the substrate. The dispenser 6 dispenses (supplies) the imprint material R (uncured resin) onto the substrate. The conveyance unit 7 includes, for example, a robot hand 7a. The conveyance unit 7 can convey the substrate W onto the substrate stage 2 and recover the substrate W from the substrate stage 2 with the robot hand 7a.

[Arrangement of Stage Driving Apparatus]

Figure 2:
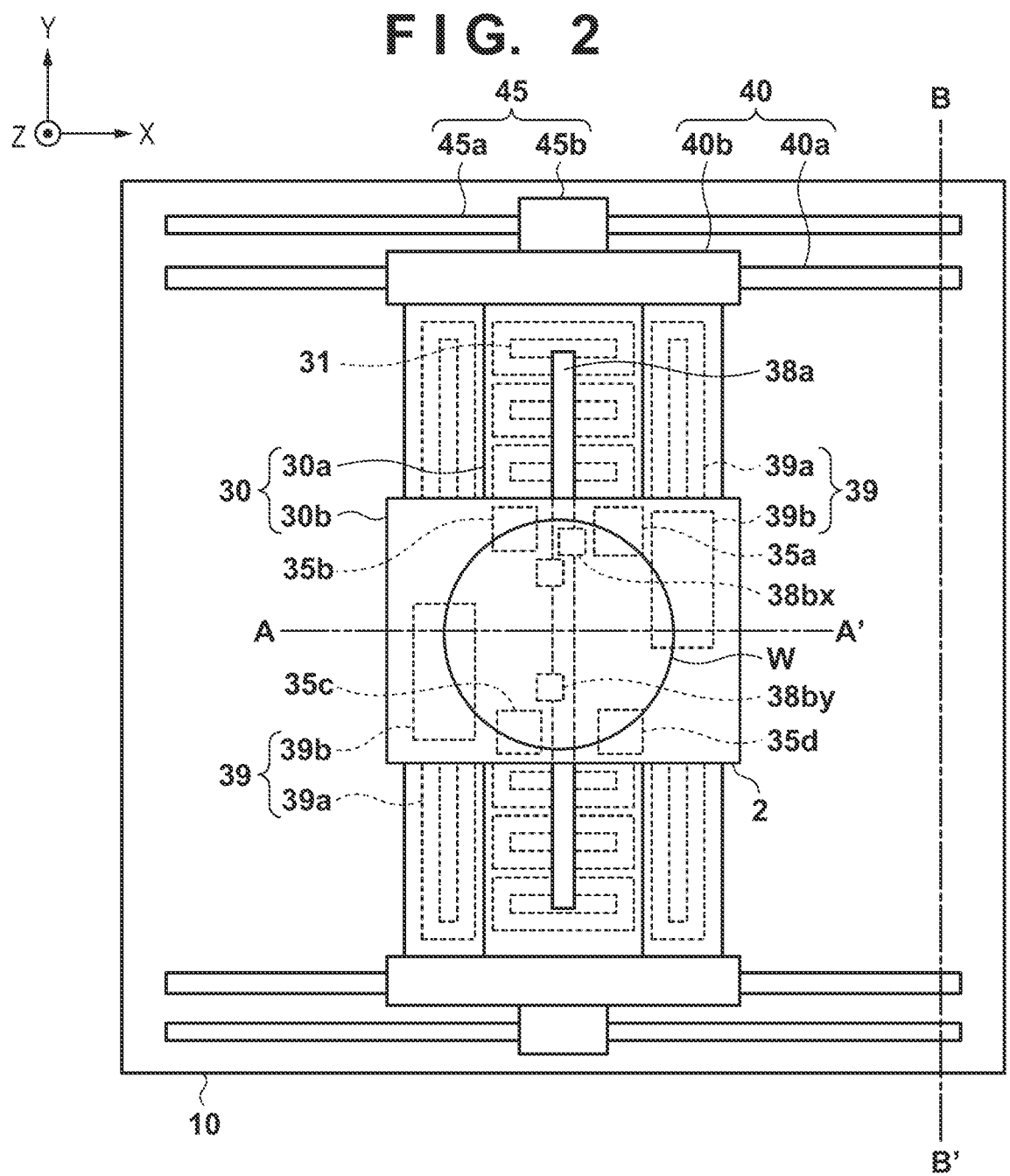
FIG. 2 is a view showing an example of the arrangement of a stage driving apparatus according to the first embodiment.
Figure 3:
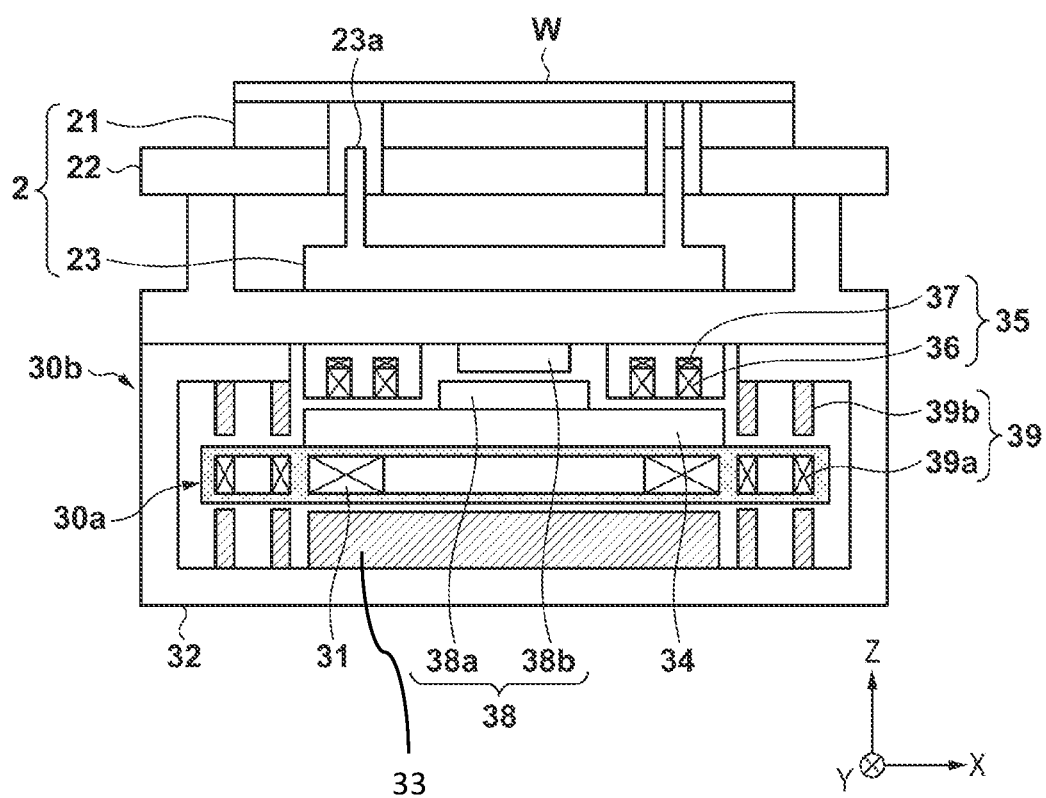
FIG. 3 is a view showing an example of the arrangement of the stage driving apparatus according to the first embodiment.
Figure 4:
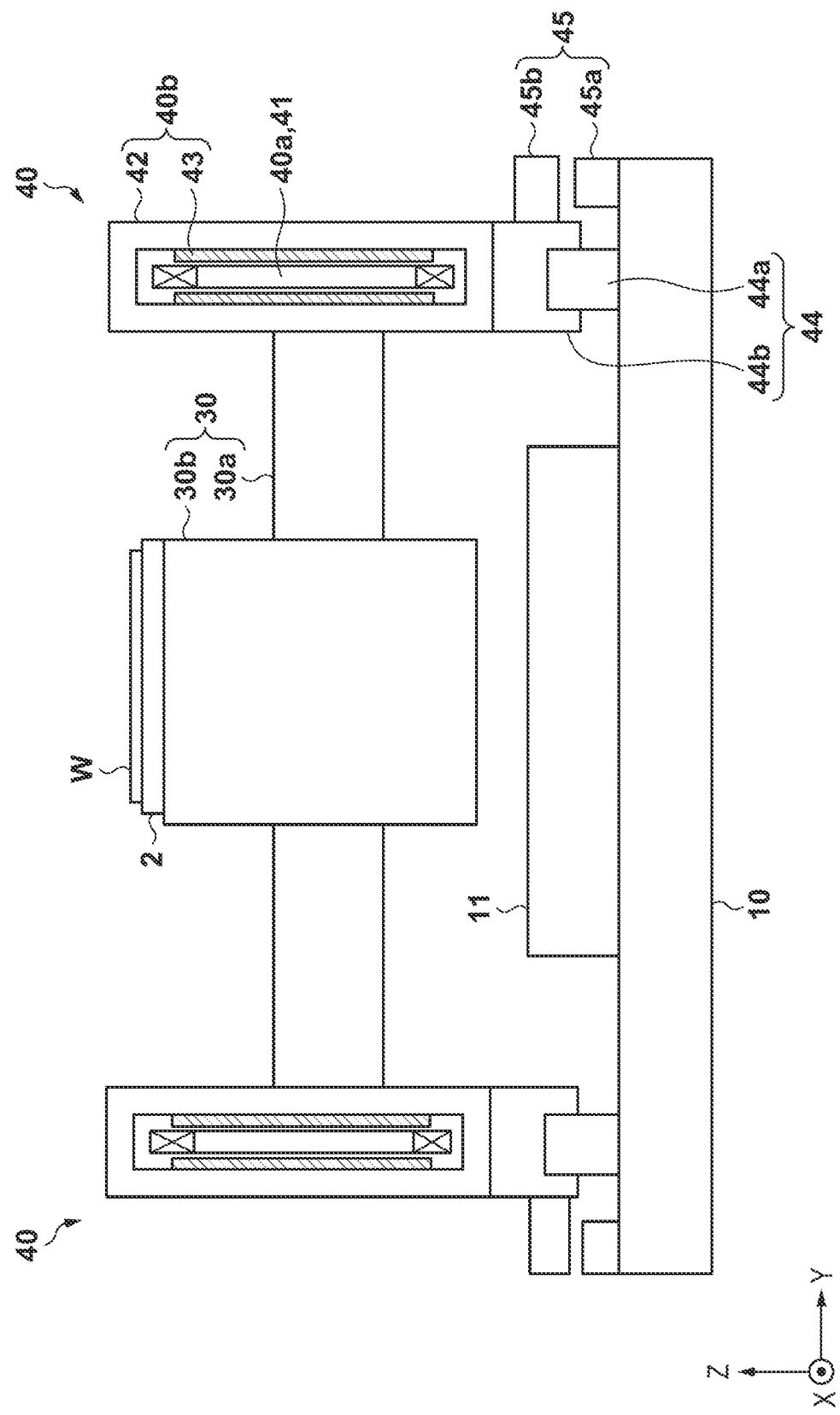
FIG. 4 is a view showing an example of the arrangement of the stage driving apparatus according to the first embodiment.

The arrangement of the stage driving apparatus that drives the substrate stage 2 will be described next with reference to FIGS. 2 to 4. FIGS. 2 to 4 are views showing an example of the arrangement of the stage driving apparatus according to this embodiment. FIG. 2 is a view of the stage driving apparatus when seen from above (+Z direction). FIG. 3 is a view when section A-A' in FIG. 2 is seen from the −Y direction. FIG. 4 is a view when section B-B' in FIG. 2 is seen from +X direction. In the case shown in FIGS. 2 to 4, the substrate stage 2 and the driving unit 3 are illustrated, but the controller 8 constituting the stage driving apparatus together with the driving unit 3 are not illustrated.

As shown in FIG. 3, the substrate stage 2 can include a substrate chuck 21 that holds a substrate by, for example, vacuum suction or the like, a support plate 22 that supports the substrate chuck 21, and a lifting mechanism 23 that lifts and lowers the substrate W with respect to the substrate chuck. The lifting mechanism 23, for example, can separate the substrate chuck 21 from the substrate W by causing a lift pin 23a to protrude from the holding surface of the substrate chuck 21 when conveying/recovering a substrate with the robot hand 7a.

The driving unit 3 can include a first linear motor 30 (first driving unit) that drives the substrate stage 2 in the Y direction and a second linear motor 40 (second driving unit) that drives the substrate stage 2 together with the first linear motor 30 in the X direction.

The arrangement of the first linear motor 30 will be described first. The first linear motor 30 includes a stator 30a on which a plurality of coils 31 are arrayed along the driving direction (Y direction) of the substrate stage 2 and a mover 30b that can move in the Y direction along the stator 30a. As shown in FIG. 3, the mover 30b includes a housing 32 through which the stator 30a extends and to which the substrate stage 2 (support plate 22) is attached and a permanent magnet 33 having a Halbach array arranged below the stator 30a in the housing 32. The controller 8 controls the energization of each coil 31 of the stator 30a to move the mover 30b (housing 32) along the stator 30a. This can drive the substrate stage 2 in the Y direction. More specifically, the controller 8 can switch the plurality of coils 31 of the stator 30a which are to be energized to thereby generate a thrust on the mover 30b in the Y direction and move the mover 30b along the stator 30a.

In the first linear motor 30 according to this embodiment, the stator 30a further includes a yoke member 34, and the mover 30b further includes an electromagnet 35 provided above the stator 30a in the housing 32. The yoke member 34 is formed from, for example, a metal material, and can be provided to cover the electromagnet side of the plurality of coils 31. The electromagnet 35 can be formed from an E-shaped magnetic core to which, for example, an energizing coil 36 and a search coil 37 are attached. The controller 8 controls energization to the energizing coil 36 to match the attractive force acting between the yoke member 34 and the permanent magnet 33 with the attractive force acting between the yoke member 34 and the electromagnet 35 based on the interlinkage magnetic flux amount detected by the search coil 37. This can float the mover 30b relative to the stator 30a. As shown in FIG. 2, a plurality of electromagnets 35 (four electromagnets 35a to 35d in FIG. 2) are provided so as to be separated from each other in the X and Y directions. Providing the plurality of electromagnets 35 in this manner can control the orientation (tilt) of the substrate stage 2 around an axis parallel to the driving direction (ωY direction) and an axis perpendicular to the driving direction (ωX direction) by adjusting the attractive force acting between each electromagnet 35 and the yoke member 34.

Figure 5:
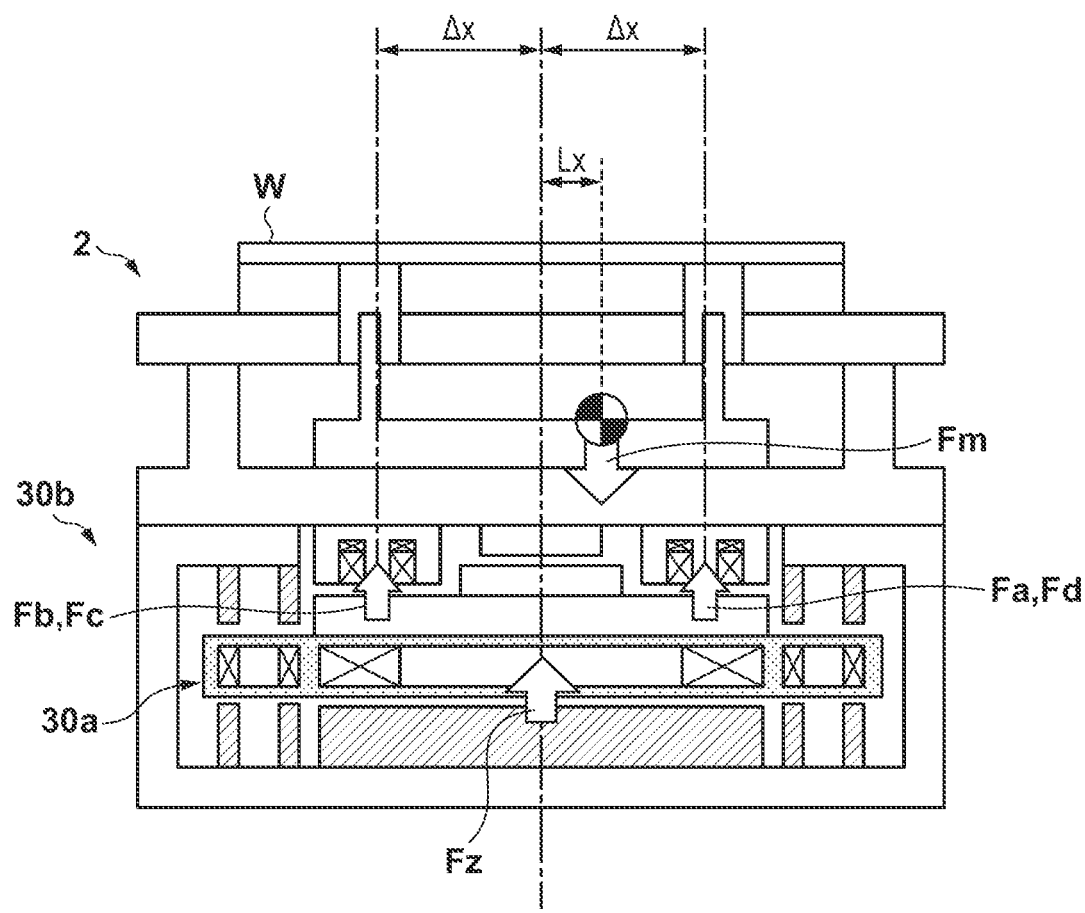
FIG. 5 is a view for explaining the attractive force generated by a first linear motor.

For example, as shown in FIG. 5, let Fz be the attractive force (Z direction) acting between the yoke member 34 and the permanent magnet 33, and Fa to Fd be the attractive forces (Z direction) acting between the yoke member 34 and the electromagnets 35a to 35d. In this case, in order to float the mover 30b relative to the stator 30a, as expressed by the following equation (1), it is necessary to match the resultant force of the attractive force Fz and the attractive forces Fa to Fd with a gravity Fm generated by a self weight in of the mover 30b (including the self weight of the substrate stage 2). Accordingly, the controller 8 can float the mover 30b relative to the stator 30a by controlling energization to the energizing coil 36 of each of the electromagnets 35a to 35d so as to satisfy equation (1) based on the detection result obtained by the search coil 37.

$$Fz+Fa+Fb+Fc+Fd=Fm \quad (1)$$

Letting Lx be the shift amount in the X direction between the center of gravity of the stator 30a and the center of gravity of the mover 30b and Δx be the distance of each electromagnet 35 from the center of gravity of the stator 30a, a moment around an axis (ωY direction) parallel to the driving direction needs to satisfy equation (2) given below. Likewise, letting Ly be the shift amount in the Y direction between the center of gravity of the stator 30a and the center of gravity of the mover 30b and Δy be the distance of each electromagnet 35 from the center of gravity of the stator 30a, a moment around an axis (ωX direction) perpendicular to the driving direction needs to satisfy equation (3) given below. Accordingly, the controller 8 can control the orientation of the stator 30a (that is, the substrate stage 2) by controlling energization to the energizing coil 36 of each electromagnet 35 so as to satisfy equations (2) and (3) based on the detection result obtained by the search coil 37.

$$(-Fa+Fb+Fc-Fd)\cdot \Delta x = Fm \cdot Lx \quad (2)$$

$$(Fa+Fb-Fc-Fd)\cdot \Delta y = Fm \cdot Ly \quad (3)$$

The first linear motor 30 can be provided with an encoder 38 for measuring the position of the mover 30b and an adjustment mechanism 39 for adjusting the relative position between the stator 30a and the mover 30b in a lateral direction (X direction) perpendicular to the driving direction.

The encoder 38 includes a scale 38a that is attached to the stator 30a and extends in the Y direction and a head 38b (light-receiving unit) attached to the mover 30b, and is arranged between the plurality of electromagnets 35 in the X direction. As shown in FIG. 2, the encoder 38 according to this embodiment can include two heads 38by for measuring the Y-direction position of the mover 30b relative to the stator 30a and a head 38bx for measuring the X-direction position of the mover 30b relative to the stator 30a. Providing the two heads 38by for measuring a Y-direction position can also measure the orientation (rotation amount) of the substrate stage 2 around the Z-axis (ωZ direction).

As shown in FIGS. 2 and 3, the adjustment mechanism 39 includes a second coil 39a attached to a side surface of the stator 30a (the plurality of coils 31) in the X direction and a second permanent magnet 39b attached to the mover 30b so as to vertically sandwich part of the second coil 39a. As shown in FIG. 2, the second coil 39a is extended to have a length in the Y direction larger than the arrangement range of the plurality of coils 31 of the stator 30a (or the movable range of the mover in the Y direction), and can be formed integrally with the stator 30a by using a high-temperature resin. Adjustment mechanisms 39 are preferably provided on the both side surfaces of the stator 30a in the X direction. In this case, as shown in FIG. 2, when the second permanent magnets 39b are arranged on the adjustment mechanisms 39 on the both side surfaces so as to be shifted from each other in the Y direction, it is possible to adjust the orientation of the substrate stage 2 around the Z-axis (ωZ direction) in addition to the relative position in the X direction. In the adjustment mechanism 39, the controller 8 then controls the energization of the second coil 39a based on the position (X direction) and the orientation (ωZ direction) of the substrate stage 2 which are measured by the encoder 38. This makes it possible to generate a thrust in the X direction between the stator 30a and the mover 30b and adjust the relative positions (X direction) and the relative orientations (ωZ direction) of the stator 30a and the mover 30b.

In this case, the first linear motor 30 according to this embodiment is configured such that the permanent magnet 33 is arranged below the stator 30a, and the electromagnet 35 is arranged above the stator 30a. However, this is not exhaustive. The permanent magnet 33 may be arranged on one of the upper side and the lower side of the stator 30a, and the electromagnet 35 may be arranged on the other side. More specifically, the electromagnet 35 may be arranged below the stator 30a, and the permanent magnet 33 may be arranged above the stator 30a. In this case, the yoke member 34 is attached to the lower side of the stator 30a so as to cover the electromagnet side of the plurality of coils 31.

The arrangement of the second linear motor 40 will be described next. As shown in FIG. 4, the second linear motor 40 includes a stator 40a on which a plurality of coils 41 are arranged along the driving direction (X direction) of the substrate stage 2 and a mover 40b movable in the X direction along the stator 40a. The mover 40b includes a housing 42 through which the stator 40a extends and to which the stator 30a of the first linear motor 30 is attached and permanent magnets 43 having a Halbach array arranged in the housing so as to sandwich the stator 40a in the Y direction. The controller 8 controls the energization of each coil 41 of the stator 40a to move the mover 40b (housing 42) along the stator 40a. This can move the substrate stage 2, together with the first linear motor 30, in the X direction. More specifically, the controller 8 can switch the plurality of coils 41 of the stator 40a which are to be energized to thereby generate a thrust on the mover 40b in the X direction and move the mover 40b along the stator 40a.

The second linear motor 40 is provided with a guide mechanism 44 for guiding the movement of the mover 40b in the X direction and an encoder 45 for measuring the X-direction position of the mover 40b. The guide mechanism 44 includes a rail 44a that is attached to the base 10 and extends in the X direction and a carrier 44b that is attached to the mover 40b and is movable on the rail 44a. The encoder 45 includes a scale 45a that is attached to the base 10 and extends in the X direction and a head 45b (light-receiving unit) attached to the mover 40b.

This embodiment uses, as the second linear motor 40, a movable magnet type linear motor that moves a mover having a magnet with a Lorentz force. However, this is not exhaustive. For example, the embodiment may use a movable coil type linear motor that moves a mover having a coil with a Lorentz force. In addition, the embodiment uses the second linear motor 40 as a second driving unit that drives the substrate stage 2, together with the first linear motor 30, in the X direction. However, the embodiment may use a driving mechanism other than a linear motor, such as a stepping magnetic motor, instead of the second linear motor 40.

[Comparison with Conventional Arrangement]

Figure 6A:
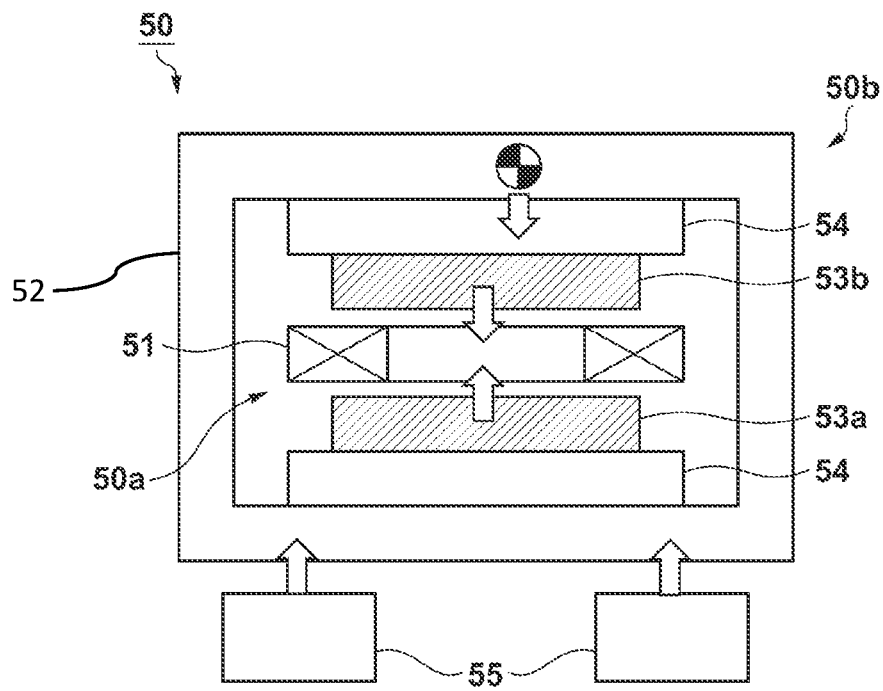
FIGS. 6A and 6B are views for explaining the principle of generating a floating force on the mover.
Figure 6B:
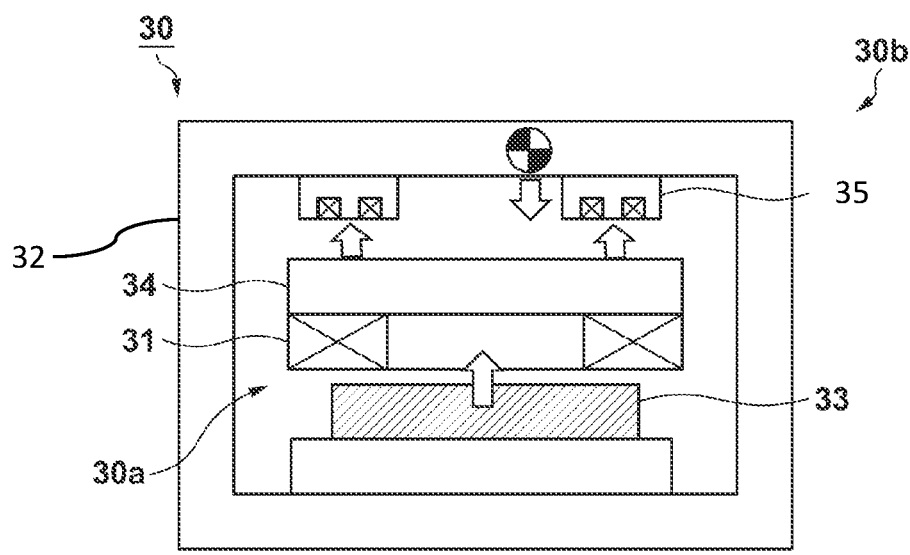

The principle of the first linear motor 30 according to this embodiment that gives a Z-direction floating force to the mover 30b by using the plurality of coils 31 for giving a Y-direction thrust to the mover 30b will be described in comparison with the arrangement of a conventional linear motor 50. FIGS. 6A and 6B are views for explaining the principle of generating a floating force on the mover 30b in the first linear motor 30 according to the embodiment. FIG. 6A is a schematic view showing the arrangement of the conventional linear motor 50. FIG. 6B is a schematic view showing the arrangement of the first linear motor 30 according to the embodiment. Note that FIG. 6B omits the illustration of the adjustment mechanism 39 (the second coil 39a and the second permanent magnet 39b) for the sake of easy understanding.

As shown in FIG. 6A, in a mover 50b of the linear motor 50, a pair of permanent magnets 53a and 53b respectively attached to a housing 52 through yoke members 5 vertically sandwich a plurality of coils 51 on a stator 50a. Although attractive forces like those indicated by the arrows act between the permanent magnets 53a and 53b and the respective coils 51 arranged in this manner, these attractive forces are internal forces in view of the overall mover 50b and cancel each other. That is, the conventional linear motor 50 cannot generate a floating force large enough to support the self weight of the mover 50b, and hence needs to be provided with a self weight compensation mechanism 55 such as a static pressure bearing (air bearing or magnetic bearing).

As shown in FIG. 6B, in the first linear motor 30 according to this embodiment, the electromagnet 35 is provide above the stator 30a of the mover 30b, and the yoke member 34 is provided on the stator 30a so as to cover the electromagnet side of the plurality of coils 31. With this arrangement, the attractive force acting between the permanent magnet 33 of the mover 30b arranged below the stator 30a and the coils 31 of the stator 30a can generate a floating force large enough to support the self weight of the mover 30b. Controlling the attractive force acting between the electromagnet 35 and the yoke member 34 can keep balance between the floating force and the gravity of the mover 30b.

As described above, in the first linear motor 30 of the stage driving apparatus according to this embodiment, the mover 30b includes the permanent magnet 33 arranged below the stator 30a and the electromagnet 35 arranged above the stator 30a. The stator 30a includes the yoke member 34 arranged to cover the electromagnet side of the plurality of coils 31. With this arrangement, the first linear motor 30 can give a Z-direction floating force to the mover 30b relative to the stator 30a by using the plurality of coils 31 for giving a Y-direction thrust to the mover 30b. That is, the first linear motor 30 can float the mover 30b with a simple arrangement as compared with a conventional arrangement separately provided with a static pressure bearing (an air bearing, magnetic bearing, or the like) for floating the mover 30b.

In this case, the stage driving apparatus according to this embodiment uses the first linear motor 30 described above to reduce the degree of importance of the material and processing accuracy (surface roughness, flatness, and the like) of the base 10. Accordingly, the embodiment can use a material having a lower density than the iron material that has been conventionally used as the material of the base 10, or can form the base 10 into a welded structure, rib structure, hollow structure, or the like. This can greatly reduce the total weight of the stage driving apparatus. Materials that can be used for the base 10 include, for example, an aluminum alloy, ceramics, magnesium alloy, fiber-reinforced plastic (FRP), and carbon fiber reinforced plastic (CFRP).

As shown in FIG. 4, a reduction mechanism 11 for reducing the influence of particles (foreign particles) on pattern formation on a substrate can be provided below the mover 30b of the first linear motor 30 (for example, below the moving region of the mover 30b). That is, the reduction mechanism 11 can be provided between the mover 30b and the base 10 so as to allow the mover 30b of the first linear motor 30 pass above the reduction mechanism 11. Examples of the reduction mechanism 11 include a charge-removing mechanism for removing charge from the mold M, a dust collection mechanism for collecting (recovering) particles in the apparatus, an exhaust mechanism for exhausting the apparatus, a generation mechanism for generating air currents along the X and Y directions, and a supply mechanism for supplying clean air into the apparatus. When, for example, a charge-removing mechanism is used as the reduction mechanism 11, charge can be efficiently removed from the mold M because an ionized gas or ultraviolet light can be applied to the mold M from below.

Second Embodiment

An imprint apparatus according to the second embodiment of the present invention will be described. The imprint apparatus according to the second embodiment basically inherits the arrangement of the imprint apparatus 100 according to the first embodiment, and can include the stage driving apparatus having the first linear motor 30 described above.

When an imprint apparatus causes a pattern formation error due to particles, the stage driving apparatus is sometimes pulled out from the imprint apparatus to perform maintenance work such as cleaning and part replacement. Accordingly, the stage driving apparatus according to this embodiment is configured to allow a substrate stage 2 (first linear motor 30) to be pulled out from the imprint apparatus.

FIG. 7 is a view when the stage driving apparatus according to this embodiment is seen from above. As shown in FIG. 7, the stage driving apparatus according to the embodiment can be configured so as to allow a mover 40b of a second linear motor 40 and rail 44a of a guide mechanism 44 to extend (be pulled out) out of the imprint apparatus (base 10). In this case, a scale 45a of an encoder 45 can be configured to extend out of the imprint apparatus, and another measurement unit such as a laser interferometer may be used instead of the encoder. In the stage driving apparatus according to the embodiment, because a mover 30b of the first linear motor 30 is in a floated state relative to a stator 30a, the floated state of the mover 30b can be maintained even when the first linear motor 30 is moved out of the base 10.

Third Embodiment

Figure 8:
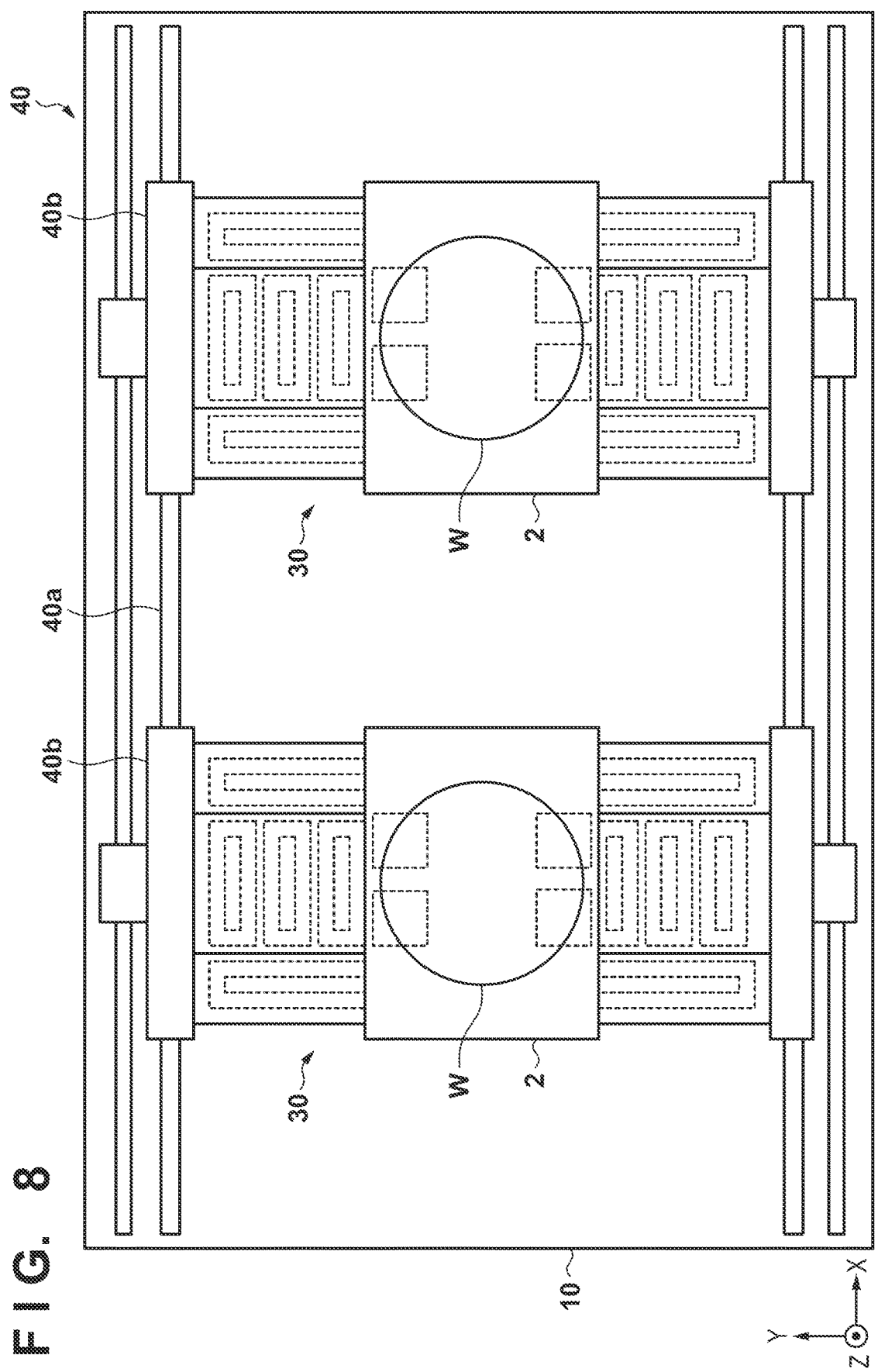
FIG. 8 is a view showing an example of the arrangement of a stage driving apparatus according to the third embodiment.

The third embodiment of the present invention will be described. FIG. 8 is a view when a stage driving apparatus according to this embodiment is seen from above. The stage driving apparatus according to the embodiment includes a plurality of substrate stages 2 and a plurality of first linear motors 30 that respectively drive the plurality of substrate stages 2 in the Y direction. A second linear motor 40 can include a plurality of movers 40b provided in correspondence with the plurality of substrate stages 2 and a stator 40a commonly provided for the plurality of movers 40b. In this stage driving apparatus, the stator 40a of the second linear motor 40 switches energization to coils 41 in accordance with the positions of the respective movers 40b, thereby controlling the driving of each substrate stage 2 (each mover 40b). This can implement clustering provided with a plurality of substrate stages and improve throughput.

Fourth Embodiment

Figure 9:
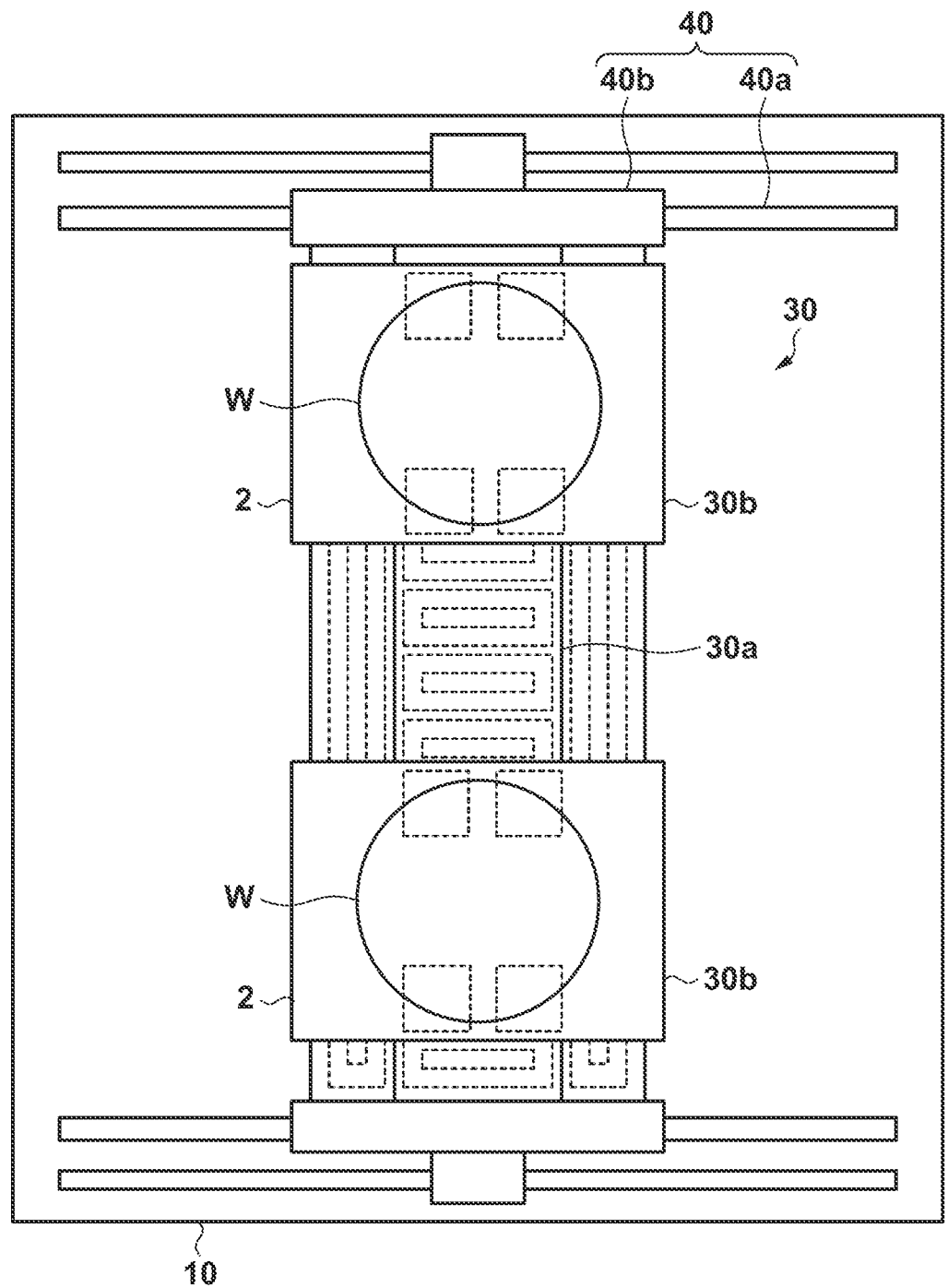
FIG. 9 is a view showing an example of the arrangement of a stage driving apparatus according to the fourth embodiment.

The fourth embodiment of the present invention will be described. FIG. 9 is a view when a stage driving apparatus according to this embodiment is seen from above. The stage driving apparatus according to the embodiment includes a plurality of substrate stages 2 and a first linear motor 30 that drives each of the plurality of substrate stages 2 in the Y direction. The first linear motor 30 according to the embodiment can include a plurality of movers 30b provided in correspondence with the plurality of substrate stages 2 and a stator 30a commonly provided for the plurality of movers 30b. In this stage driving apparatus, the stator 30a of the first linear motor 30 switches energization to coils 31 in accordance with the positions of the respective movers 30b, thereby controlling the driving of each substrate stage 2 (each mover 30b). This can implement clustering provided with the plurality of substrate stages 2 and improve throughput.

<Embodiment of Method of Manufacturing Article>

A method of manufacturing an article according to an embodiment of the present invention is suitable to manufacturing an article such as an element having a microstructure or micro-device such as a semiconductor device, for example. The method of manufacturing an article of the present embodiment includes a step for using the above described imprint apparatus (imprint method) to form a pattern on an imprint material supplied (applied) to a substrate, and a step of processing the substrate on which the pattern was formed in that step. Furthermore, the corresponding manufacturing method includes other well-known steps (such as oxidation, film formation, vapor deposition, doping, planarization, etching, resist separation, dicing, bonding, and packaging). The method of manufacturing an article of the present embodiment is advantageous in at least one of capabilities, quality, productivity, and manufacturing cost for the article in comparison to a conventional method.

A pattern of a cured material formed by using an imprint apparatus is used permanently for at least some of various articles, or is used temporarily when manufacturing various articles. An article is an electric circuit element, an optical element, a MEMS, a recording element, a sensor, a mold, or the like. The electric circuit element may be a volatile or nonvolatile semiconductor memory such as a DRAM, an SRAM, a flash memory, and an MRAM, a semiconductor element such as an LSI, a CCD, an image sensor, and an FPGA, or the like. The mold may be, for example, a mold for imprinting.

A pattern of a cured material is used unchanged as at least a portion of a constituent member of the foregoing article, or is temporarily used as a resist mask. The resist mask is removed after etching, ion implantation, or the like is performed in steps for processing the substrate.

Figure 10A:
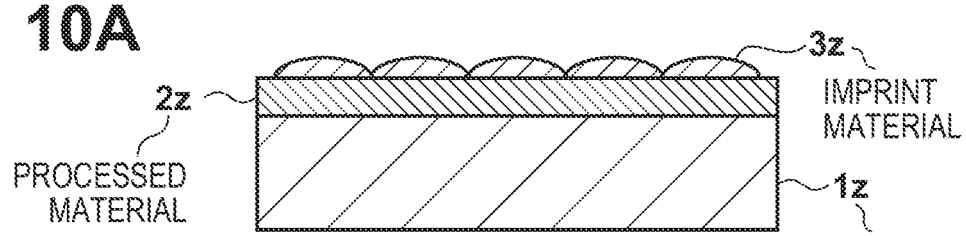
FIGS. 10A to 10F are views showing a method of manufacturing an article.

Next, description is given regarding a detailed method of manufacturing the article. As illustrated in FIG. 10A, a substrate 1z, which is a silicon wafer on the surface of which a processed material 2z which is an insulating member or the like is formed, is prepared, and then, by an ink jet method or the like, an imprint material 3z is applied to the surface of the processed material 2z. Here, a situation where the imprint material 3z in a plurality of droplet shapes has been applied onto the substrate is illustrated.

Figure 10B:
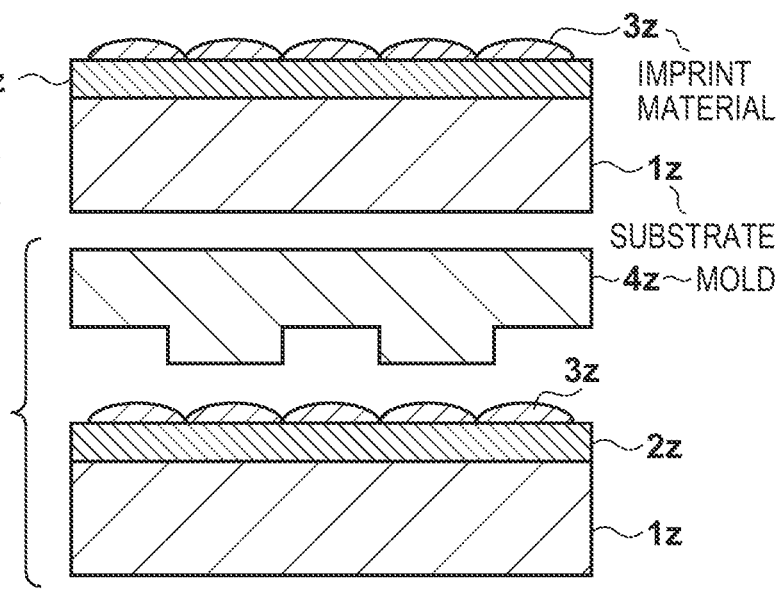
Figure 10C:
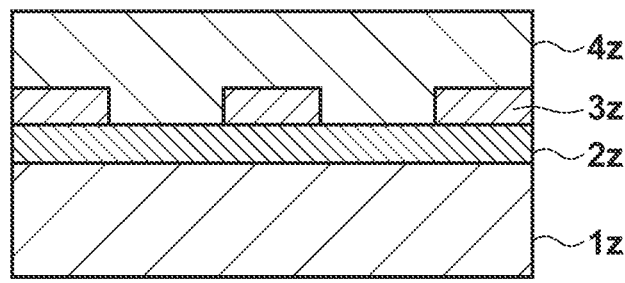

As illustrated in FIG. 10B, a mold 4z for imprinting is oriented so that a side thereof where a pattern composed of concave and convex portions is formed is caused to face toward the imprint material 3z on the substrate. As illustrated in FIG. 10C, the substrate 1z to which the imprint material 3z has been applied and the mold 4z are caused to be in contact, and pressure is applied. The imprint material 3z is filled into the spaces between the mold 4z and the processed material 2z. When light as energy for curing irradiates through the mold 4z in this state, the imprint material 3z is cured.

Figure 10D:
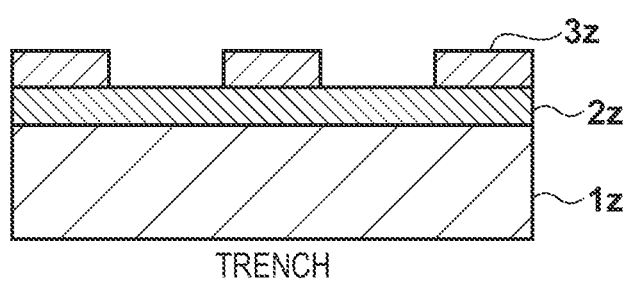

As indicated in FIG. 10D, when the mold 4z and the substrate 1z are separated after the imprint material 3z is cured, a pattern of the cured material of the imprint material 3z is formed on the substrate 1z. The pattern of this cured material has a shape where a concave portion of the mold corresponds to a convex portion of the cured material and a convex portion of the mold corresponds to a concave portion of the cured material, in other words the pattern composed of concave and convex portions of the mold 4z ends up being transferred to the imprint material 3z.

Figure 10E:
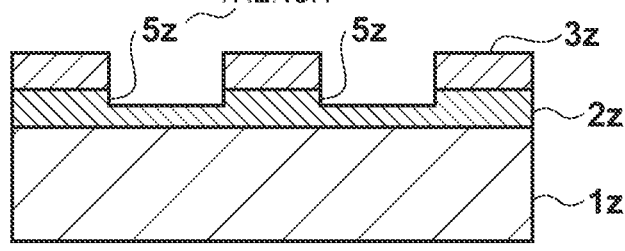
Figure 10F:
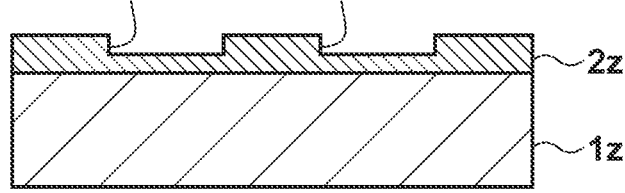

As illustrated in FIG. 10E, when the pattern of the cured material is etched as an etching resistant mask, portions out of the surface of the processed material 2z where the cured material is not present or thinly remains are removed, and grooves 5z are achieved. As illustrated in FIG. 10F, when the pattern of the cured material is removed, it is possible to achieve an article in which the grooves 5z are formed on the surface of the processed material 2z. The pattern of the cured material is removed here, but, for example, the pattern may be used as a film for insulation between layers included in a semiconductor element or the like without being removed after processing, in other words as a constituent member of the article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-069173 filed on Mar. 30, 2018, which is hereby incorporated by reference herein in its entirety.

What is claimed is:

1. A stage driving apparatus for driving a stage, the stage driving apparatus comprising:
    a linear motor including:
        a stator with a plurality of coils arrayed along a driving direction of the stage, and including a yoke member provided to cover an upper side of the plurality of coils; and
        a mover provided with the stage; and
    a controller configured to control the linear motor,
    wherein the mover includes:
        a permanent magnet arranged below the plurality of coils; and
        an electromagnet arranged above the yoke member, and
    wherein the controller controls driving of the stage in the driving direction while controlling floating of the mover relative to the stator, by controlling energization of the plurality of coils and the electromagnet.

2. The stage driving apparatus according to claim 1, wherein:
    the mover includes a plurality of the electromagnets, and
    the controller controls an orientation of the stage by controlling energization of the plurality of electromagnets.

3. The stage driving apparatus according to claim 2, further comprising:
    an encoder including a scale provided on the stator and a head provided on the mover,
    wherein the head is provided between the plurality of electromagnets.

4. The stage driving apparatus according to claim 1, further comprising:
    an adjustment mechanism configured to adjust a relative position between the stator and the mover in a lateral direction perpendicular to the driving direction,
    wherein the adjustment mechanism includes another coil provided on a side surface of the stator in the lateral direction and another permanent magnet provided on the mover, and adjusts the relative position by controlling energization of the another coil.

5. The stage driving apparatus according to claim 4, wherein the adjustment mechanism is provided for each of two side surfaces of the stator in the lateral direction.

6. The stage driving apparatus according to claim 4, wherein the another coil is configured to have a length in the driving direction that is longer than an arrangement range of the plurality of coils on the stator.

7. The stage driving apparatus according to claim 1, wherein the yoke member is formed from a metal material.

8. The stage driving apparatus according to claim 1, wherein:
    the electromagnet includes a search coil configured to detect a magnetic flux amount, and
    the controller controls energization of the electromagnet based on a detection result obtained by the search coil.

9. The stage driving apparatus according to claim 8, wherein the controller controls energization of the electromagnet based on the detection result obtained by the search coil, such that an attractive force acting between the yoke member and the energizing coil matches with an attractive force acting between the yoke member and the permanent magnet.

10. The stage driving apparatus according to claim 1, wherein the permanent magnet and the electromagnet are arranged to sandwich the plurality of coils and the yoke member of the stator in a vertical direction.

11. The stage driving apparatus according to claim 1, wherein the controller controls driving of the stage in the driving direction by controlling energization of the plurality of coils, while controlling floating of the mover relative to the stator by controlling energization of the electromagnet.

12. The stage driving apparatus according to claim 1, wherein the yoke member is:
    arranged between the plurality of coils and the electromagnet, and
    fixed to the plurality of coils of the stator so as to cover the upper side of the plurality of coils.

13. The stage driving apparatus according to claim 1, wherein the stage is configured to hold a substrate in a lithography apparatus for forming a pattern on the substrate.

14. The stage driving apparatus according to claim 1, wherein:
    the permanent magnet is arranged such that an attractive force acts between the yoke member and the permanent magnet, and
    the electromagnet is arranged such that the attractive force, which acts between the yoke member and the permanent magnet, is matched by energizing the electromagnet.

15. A lithography apparatus for forming a pattern on a substrate, the lithography apparatus comprising:
    a stage configured to hold the substrate; and
    a stage driving apparatus configured to drive the stage,
    wherein the stage driving apparatus includes:
        a linear motor including:
            a stator with a plurality of coils arrayed along a driving direction of the stage, and including a yoke member provided to cover an upper side of the plurality of coils; and
            a mover provided with the stage; and
        a controller configured to control the linear motor,
        wherein the mover includes:
            a permanent magnet arranged below the plurality of coils; and
            an electromagnet arranged above the yoke member, and
        wherein the controller controls driving of the stage in the driving direction while controlling floating of the mover relative to the stator, by controlling energization of the plurality of coils and the electromagnet.

16. The lithography apparatus according to claim 15, further comprising:
    a mechanism configured to reduce an influence of a foreign particle in pattern formation on the substrate, wherein the mechanism is arranged below a moving region of the mover.

17. The lithography apparatus according to claim 15, wherein the stage driving apparatus is configured to allow the stage to be pulled out of the lithography apparatus.

18. A stage driving apparatus for driving a stage, the apparatus comprising:
a linear motor including:
a stator with a plurality of coils arrayed along a driving direction of the stage; and
a mover provided with the stage;
a controller configured to control the linear motor; and
an adjustment mechanism configured to adjust a relative position between the stator and the mover in a lateral direction perpendicular to the driving direction,
wherein the mover includes:
a permanent magnet provided on a first side, which is one of an upper side or a lower side of the plurality of coils; and
an electromagnet provided on a second side, which is the other of the upper side or the lower side of the plurality of coils,
wherein the stator includes a yoke member covering the second side of the plurality of coils,
wherein the controller controls driving of the stage in the driving direction and floating of the mover relative to the stator, by controlling energization of the plurality of coils and the electromagnet,
wherein the adjustment mechanism includes another coil provided on a side surface of the stator in the lateral direction and another permanent magnet provided on the mover, and adjusts the relative position by controlling energization of the another coil, and wherein the another coil is configured to have a length in the driving direction that is longer than an arrangement range of the plurality of coils on the stator.

19. A method of manufacturing an article, the method comprising:
forming a pattern on a substrate using a lithography apparatus for forming a pattern on the substrate;
processing the substrate, on which the pattern has been formed, to manufacture the article,
wherein the lithography apparatus comprises:
a stage configured to hold the substrate; and
a stage driving apparatus configured to drive the stage,
wherein the stage driving apparatus includes:
a linear motor including:
a stator with a plurality of coils arrayed along a driving direction of the stage, and including a yoke member provided to cover an upper side of the plurality of coils; and
a mover provided with the stage; and
a controller configured to control the linear motor,
wherein the mover includes:
a permanent magnet arranged below the plurality of coils; and
an electromagnet arranged above the yoke member, and
wherein the controller controls driving of the stage in the driving direction while controlling floating of the mover relative to the stator, by controlling energization of the plurality of coils and the electromagnet.

* * * * *